US006691272B2

(12) United States Patent
Azim

(10) Patent No.: US 6,691,272 B2
(45) Date of Patent: Feb. 10, 2004

(54) TESTING OF HIGH SPEED DDR INTERFACE USING SINGLE CLOCK EDGE TRIGGERED TESTER DATA

(75) Inventor: Syed K. Azim, Fremont, CA (US)

(73) Assignee: LSI Logic Corporation, Milpitas, CA (US)

( * ) Notice: Subject to any disclaimer, the term of this patent is extended or adjusted under 35 U.S.C. 154(b) by 316 days.

(21) Appl. No.: 09/735,820

(22) Filed: Dec. 12, 2000

(65) Prior Publication Data
US 2002/0071334 A1 Jun. 13, 2002

(51) Int. Cl.$^7$ .............................................. G01R 31/28
(52) U.S. Cl. ........................ 714/744; 365/191; 365/233
(58) Field of Search ................................ 365/233, 191; 711/150; 371/22.3; 714/744

(56) References Cited

U.S. PATENT DOCUMENTS 4,929,889 A * 5/1990 Seiler et al. ................ 371/22.3
5,991,232 A * 11/1999 Matsumura et al. ........ 365/233
6,151,664 A * 11/2000 Borkenhagen et al. ...... 711/150
6,246,614 B1 * 6/2001 Ooishi ........................ 365/191

OTHER PUBLICATIONS

Dinh et al., An Approach to Testing 200ps Echo Clock to Output Timing on the Double Data Rate Synchronous Memory, 2000, IEEE, ITC International Test Conference, Paper 23.2, pp. 610–618.*

* cited by examiner

Primary Examiner—Albert Decady
Assistant Examiner—Dipakkumar Gandhi
(74) Attorney, Agent, or Firm—Thelen, Reid & Priest, LLP

(57) ABSTRACT

A double data rate (DDR) circuit for testing of a high speed DDR interface using single clock edge triggered tester data. The DDR testing circuit includes a first register, a second register, and a multiplexer (MUX). A clock signal is fed to the first register and the MUX. The inverse of the clock signal is fed to the second register. A tester data signal is fed to the first register which generates a latched tester data signal which is fed to the MUX. The inverse of the latched tester data signal is fed to the second register which generates a transformed tester data signal which is fed to the MUX. The MUX generates a combination of the latched tester data signal and the transformed tester data signal for transmission as an applied test data signal. The resulting applied test data signal has double the data rate of the tester data signal upon which it is based.

16 Claims, 1 Drawing Sheet

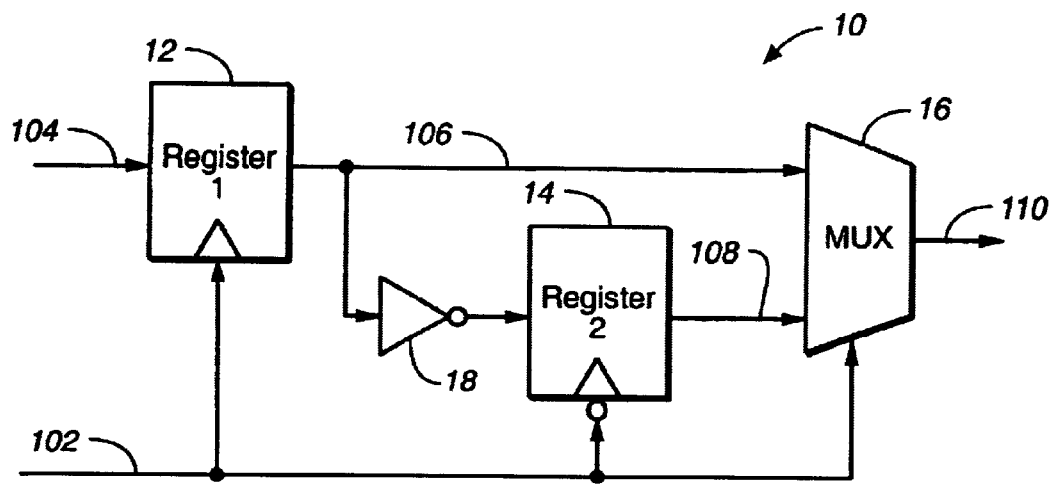
FIG._1
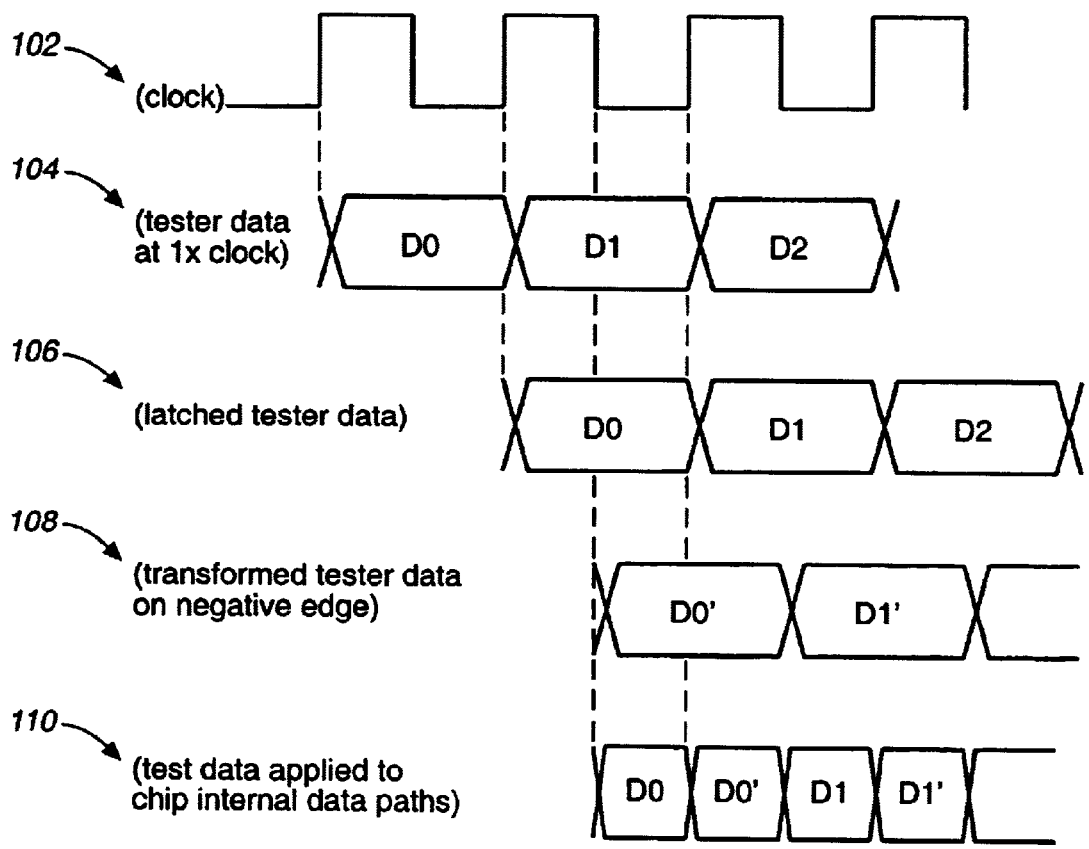
FIG._2

TESTING OF HIGH SPEED DDR INTERFACE USING SINGLE CLOCK EDGE TRIGGERED TESTER DATA

BACKGROUND OF THE INVENTION

1. Field of the Invention

The present invention relates generally to data transfers across chip boundaries. More specifically, the present invention relates to testing of a high speed double data rate interface using single clock edge triggered tester data.

2. The Background Art

Over the years, since the initial development of computers, there has been a continuing drive for higher speeds. This includes both processing speeds and communication speeds. A number of devices and techniques have been developed and adopted to increase speeds. One such technique for increasing the speed of data transfers across chip boundaries has been the use of double data rate (DDR) clocking. Under this technique, data is transferred on both the positive and negative edges of a source clock. In this way, up to twice the amount of data can be transferred using the same clock speed. For example, if the clock speed is 133 MHz, then the data transfer rate is up to 266 Mega transfers per second. This is a substantial increase in speed. The DDR clocking technique has presented circuit testers with some difficulties however.

The conventional technique for testing DDR interfaces is to supply double clock edge triggered tester data. Under the 133 MHz example above, this is data at 266 MHz. Assuming that the data rate of 133 MHz is the upper limit of speed for a particular period of development, then the tester during that period is being asked to test at twice the upper limit of speed. As a result, very careful design of the test hardware is required. Further, very careful design of the test data is required The cost of this test hardware is necessarily higher then slower test hardware of the same period. These difficulties are expected to be magnified as the upper limit of speed continues to increase.

A definite need exists for a DDR testing circuit that is less complicated and expensive than that of conventional DDR testing hardware. Specifically, a need exists for a DDR testing circuit which is internally capable of generating DDR test data. Ideally, such a circuit would be robust and inexpensive. A primary purpose of the present invention is to solve these needs and to provide further, related advantages.

BRIEF DESCRIPTION OF THE INVENTION

A double data rate (DDR) circuit for testing of a high speed DDR interface using single clock edge triggered tester data is disclosed. The DDR testing circuit includes a first register, a second register, and a multiplexer (MUX). A clock signal is fed to the first register and the MUX. The inverse of the clock signal is fed to the second register. A tester data signal is fed to the first register which generates a latched tester data signal which is fed to the MUX. The inverse of the latched tester data signal is fed to the second register which generates a transformed tester data signal which is fed to the MUX. The MUX generates a combination of the latched tester data signal and the transformed tester data signal for transmission as an applied test data signal. The resulting applied test data signal has double the data rate of the tester data signal upon which it is based.

BRIEF DESCRIPTION OF THE DRAWINGS

FIG. 1 is a block diagram of a DDR circuit according to the present invention for testing of a high speed DDR interface using single clock edge triggered tester data; and FIG. 2 is a timing diagram showing various signals for the DDR circuit of FIG. 1.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons having the benefit of this disclosure.

Turning first to FIG. 1, a block diagram of a DDR circuit 10 according to the present invention for testing of a high speed DDR interface using single clock edge triggered tester data is shown. The DDR circuit 10 includes a first register 12, a second register 14, and a MUX (multiplexer) 16. Each register 12, 14 has a data input, a clock input, and an output. The clock input of the second register 14 is inverted. The MUX 16 has two data inputs, a clock input, and an output. The output of the first register 12 is connected directly to the first input of the MUX 16 and also through an inverter 18 to the data input of the second register 14. The output of the second register 14 is connected to the second input of the MUX 16. The DDR circuit 10 is preferably integrated with the chip to be tested. An external single clock edge triggered data generator (not shown) is connected to the input of the first register 12. The external data generator inputs a tester data signal which can take any of a number of well known desired patterns including complimentary and shifted by n bits, among others. The output of the MUX 16 is connected to the internal data paths of the chip (not shown).

Turning now to FIG. 2, a timing diagram showing various signals for the DDR circuit 10 of FIG. 1 is shown. The various signals are examples only and have been generalized for discussion purposes. The reference numbers of the signals correspond to the path locations shown in FIG. 1. The various signals will be discussed in order from top to bottom. First is a clock signal 102 which has a standard fifty percent duty cycle. The clock signal 102 is fed to the registers 12, 14 and the MUX 16 of FIG. 1. Second is a tester data signal 104 which is supplied by the external data generator. The tester data signal 104 is triggered by the positive edge of the clock signal 102. The tester data signal 104 is fed to the first register 12. Third is a latched tester data signal 106 which is the output of the first register 12. The latched tester data signal 106 is delayed one cycle from the tester data signal 104. The latched tester data signal 106 is fed to the second register 14 and the MUX 16. Fourth is a transformed tester data signal 108 which is the output of the second register 14. The transformed tester data signal 108 is triggered by the negative edge of the clock signal 102 and is delayed one half cycle from the latched tester data signal 106. The transformed tester data signal 108 is fed to the MUX 16. Fifth is an applied test data signal 110 which is the output of the MUX 16. The applied test data signal 110 is a combination of the latched tester data signal 106 and the transformed tester data signal 108. The applied test data signal 110 is delayed one half cycle from the latched tester data signal 106. The applied test data signal 110 is fed to the internal data paths of the chip. Upon review, one will recognize that the applied test data signal 110 has double the data rate of the tester data signal 104 and is delayed by one and one half cycles.

The test results for the chip can be determined in one of two manners. First, two pass testing where each pass corresponds to one of the clock edges being sampled. In this way, the tester never needs to sample the chip output data signal at double the rate of the tester data signal. Second, the chip output data signal may be passed through on chip linear-feedback shift register (LFSR) logic and the signature compared with the expected results. The ultimate outcome is DDR testing without special test hardware or special test data external to the chip.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. A double data rate (DDR) circuit for testing a high speed DDR interface using single clock edge triggered tester data, said circuit comprising:

a first register having a data input, a clock input, and an output;

a second register having a data input, a clock input, and an output, the data input of said second register being coupled to the output of said first register through an inverter; and a multiplexer (MUX) having a first data input, a second data input, a clock input, and an output, the first data input being coupled to the output of said first register to receive a first tester data signal, the second data input being coupled to the output of said second register to receive a second tester data signal.

2. The DDR circuit in accordance with claim 1, wherein said DDR circuit is integrated with the circuit to be tested.

3. The DDR circuit in accordance with claim 1, wherein said MUX outputs a third tester data signal, the third taster data signal being a half clock cycle delayed form the first tester data signal and triggered by both rising edges and falling edges of the clock signal.

4. A method for testing a high speed double data rate (DDR) interface using single clock edge triggered tester data, said method comprising:

generating a latched tester data signal from a tester data signal;

generating a transformed tester data signal from the latched tester data signal by inverting and delaying by a half clock cycle the latched tester data signal; and generating an applied test data signal from the latched tester data signal and the transformed tester data signal.

5. The method in accordance with claim 4, further comprising:

sampling an output data signal on a positive edge of a source clock; and sampling the output data signal on a negative edge of the source clock.

6. The method in accordance with claim 4, further comprising:

passing an output data signal through integrated linear-feedback shift register logic to receive a signature signal; and comparing the signature signal with an expected result.

7. The method in accordance with claim 4, wherein the applied test data signal is a half clock cycle delayed form the latched tester data signal and triggered by both rising edges and falling edges of the clock signal.

8. A double data rate (DDR) device for testing a high speed DDR interface using single clock edge triggered tester data, said circuit comprising:

means for generating a latched tester data signal from a tester data signal;

means for generating a transformed tester data signal from the latched tester data signal by inverting and delaying by a half clock cycle the latched tester data signal; and means for generating an applied test data signal from the latched tester data signal and the transformed tester data signal.

9. The DDR device in accordance with claim 8, wherein the DDR device is integrated with the circuit to be tested.

10. The DDR device in accordance with claim 8, further comprising:

means for sampling an output data signal on a positive edge of a source clock; and means for sampling the output data signal on a negative edge of the source clock.

11. The DDR device in accordance with claim 8, further comprising:

means for passing an output data signal through integrated linear-feedback shift register logic to receive a signature signal; and means for comparing the signature signal with an expected result.

12. The DDR device in accordance with claim 8, wherein the applied test data signal is a half clock cycle delayed form the latched tester data signal and triggered by both rising edges and falling edges of the clock signal.

13. A method for generating an applied test data signal for a high speed double data rate (DDR) interface, said method comprising:

receiving a single-edge triggered tester data signal, the single-edge triggered tester data signal being triggered by either rising edges or falling edges of a clock signal;

latching the single-edge triggered tester data signal to generate a first tester data signal;

inverting and delaying by a half clock cycle the first tester data signal to generate a second tester data signal; and multiplexing the first tester data signal and the second tester data signal to generate a third tester data signal, the third tester data signal being triggered by both of the rising edges and the falling edges of the clock signal.

14. The method in accordance with claim 13, wherein the third tester data signal is a half clock cycle delayed form the first tester data signal.

15. An apparatus for generating an applied test data signal for a high speed double data rate (DDR) interface, said apparatus comprising:

means for receiving a single-edge triggered tester data signal, the single-edge triggered tester data signal being triggered by either rising edges or falling edges of a clock signal;

means for latching the single-edge triggered tester data signal to generate a first tester data signal;

means for inverting and delaying by a half clock cycle the first tester data signal to generate a second tester data signal; and means for multiplexing the first tester data signal and the second tester data signal to generate a third tester data signal, the third tester data signal being triggered by both of the rising edges and the falling edges of the clock signal.

16. The apparatus in accordance with claim 15, wherein the third tester data signal is a half clock cycle delayed form the first tester data signal.

* * * * *